United States Patent
Kim et al.

(10) Patent No.: US 7,220,993 B2
(45) Date of Patent: May 22, 2007

(54) THIN FILM TRANSISTOR HAVING A METAL INDUCED LATERAL CRYSTALLIZATION REGION AND METHOD FOR FABRICATING THE SAME

(75) Inventors: Hoon Kim, Seoul (KR); Jin-Wook Seo, Suwon-si (KR); Ki-Yong Lee, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/990,514

(22) Filed: Nov. 18, 2004

(65) Prior Publication Data
US 2005/0110015 A1 May 26, 2005

(30) Foreign Application Priority Data
Nov. 22, 2003 (KR) .................. 10-2003-0083390

(51) Int. Cl.
*H01L 29/76* (2006.01)
(52) U.S. Cl. ................... 257/66; 257/69; 438/157
(58) Field of Classification Search ............... None
See application file for complete search history.

(56) References Cited

U.S. PATENT DOCUMENTS 6,501,095 B2 * 12/2002 Yamaguchi et al.
2003/0089907 A1 * 5/2003 Yamaguchi et al.
2004/0166655 A1 * 8/2004 Wong et al.

FOREIGN PATENT DOCUMENTS

| CN | 1109212 | 9/1995 |
| CN | 1186326 | 7/1998 |
| CN | 1431718 | 7/2003 |
| KR | 10-1999-0039331 | 6/1999 |
| KR | 10-2002-0036926 | 5/2002 |

\* cited by examiner

*Primary Examiner*—Leonardo Andújar
(74) *Attorney, Agent, or Firm*—H.C. Park & Associates, PLC

(57) ABSTRACT

A thin film transistor and method for fabricating the same are provided. The thin film transistor comprises a semiconductor layer having a MILC region that has first crystalline grains crystallized by MILC method and second crystalline grains disposed between the first crystalline grains and having different crystalline properties from the first crystalline grains.

12 Claims, 4 Drawing Sheets

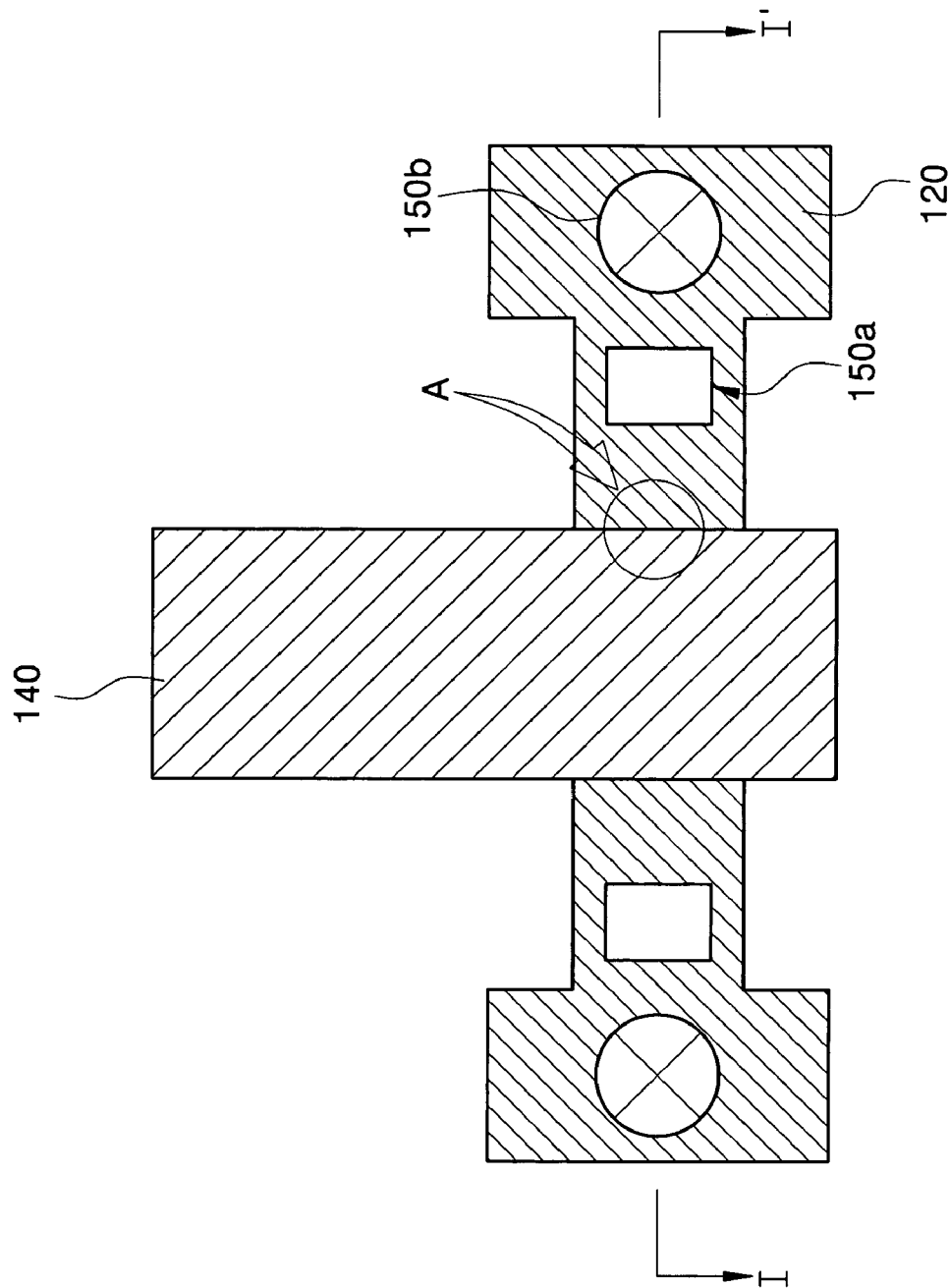

THIN FILM TRANSISTOR HAVING A METAL INDUCED LATERAL CRYSTALLIZATION REGION AND METHOD FOR FABRICATING THE SAME

CROSS-REFERENCE TO RELATED APPLICATION

This application claims the benefit of Korean Patent Application No. 2003-83390, filed Nov. 22, 2003, the disclosure of which is incorporated herein by reference in its entirety.

BACKGROUND OF THE INVENTION

1. Field of the Invention

The present invention relates to a thin film transistor and method for fabricating the same. More particularly, the present invention relates to a thin film transistor and method for fabricating the same wherein a polysilicon layer is used as a semiconductor layer.

2. Description of the Related Art

Generally, a thin film transistor comprises a semiconductor layer, a gate insulating layer and a gate electrode. Further, the semiconductor layer is typically a polysilicon layer whose electron mobility is 100 times higher than that of an amorphous silicon layer.

A polysilicon semiconductor layer is typically manufactured by forming an amorphous silicon layer on the substrate and then crystallizing the amorphous silicon layer. The crystallization method may, for example, include an excimer laser annealilng (ELA) method, a sequential lateral solidification (SLS) method, a method induced crystallization (MIC) method, or a metal induced lateral crystallization (MILC) method.

Among them, the MILC method has the advantages that uniformity properties and reduction of production costs can be obtained more easily than with the ELA method. Moreover, contamination of a channel region due to metal can be reduced compared with the MIC method.

MILC may be performed by coating some regions of the amorphous silicon layer formed on the substrate with a crystallization-inducing metal layer and by performing heat treatment. In the heat treatment, a region that contacts the crystallization-inducing metal layer may be crystallized by the MIC method, and a region that does not contact the crystallization-inducing metal layer may be crystallized by the MILC method.

Crystalline grains formed by the MILC method have an orientation, and are generally grown in an elongated form. Amongst the crystalline grains, a region can exist in which crystallization is not made by the MILC method, and amorphous silicon remains. The region where the amorphous silicon remains can be a factor that degrades electrical characteristics such as electron mobility. It can also decrease the uniformity of the electrical characteristics in the substrate.

SUMMARY OF THE INVENTION

The present invention provides a thin film transistor and method for fabricating the same that improves not only electrical characteristics, such as electron mobility, but also uniformity of the electrical characteristics all over the substrate.

An aspect of the present invention is to provide a thin film transistor. The thin film transistor comprises a semiconductor layer having a MILC region that has first crystalline grains crystallized by MILC and second crystalline grains disposed between the first crystalline grains and having different crystalline properties from the first crystalline grains.

This invention may help to provide a thin-film transistor and method of manufacturing the same. In particular, the invention may provide a thin-film transistor which may be manufactured using a two step heating process for polycrystallization of the semiconductor. The first step may be at a lower temperature and the second step may be at a higher temperature. The first step begins crystalline growth but leaves areas at the boundary of two directions of crystalline growth. The area at these boundaries contains remaining amorphous silicon. This amorphous silicon is undesirable. Accordingly, a second heat treatment at a higher temperature is performed that creates a small grain MIC-type polycystallization of the amorphous silicon in the boundary area.

BRIEF DESCRIPTION OF THE DRAWINGS

The above and other features and advantages of the present invention will become more apparent to those of ordinary skill in the art by the following detailed description with reference to the attached drawings which are briefly described below.

FIG. 1 is a plan view showing a thin film transistor according to an embodiment of the present invention.

DETAILED DESCRIPTION OF THE INVENTION

Figure 2A:
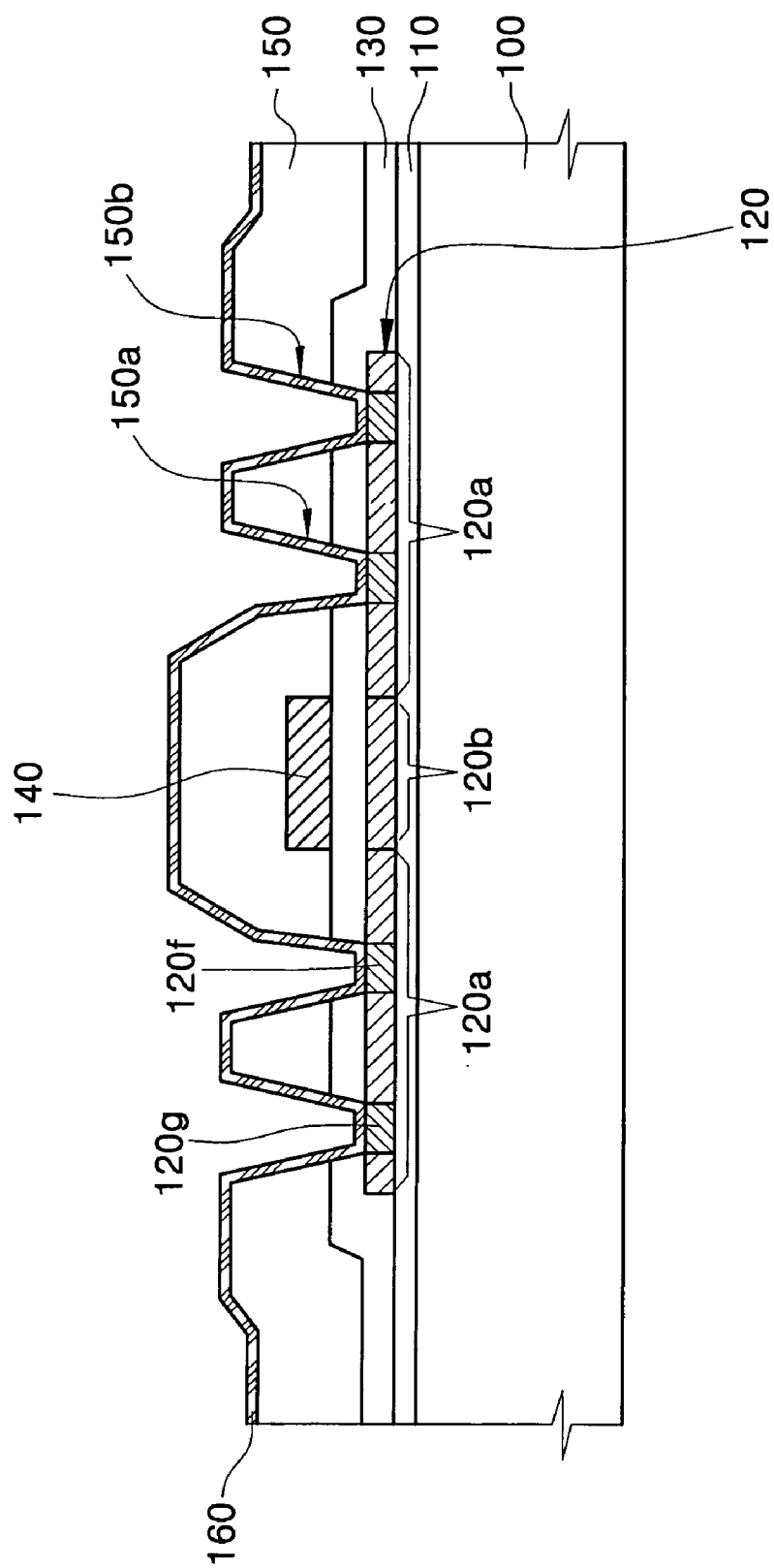
FIGS. 2A and 2B are cross-sectional views for illustrating a thin film transistor and method for fabricating the same according to an embodiment of the present invention taken along the line I–I' of FIG. 1.

The present invention will now be described more fully with reference to the accompanying drawings, in which preferred embodiments of the invention are shown. This invention may, however, be embodied in different forms and should not be construed as limited to the embodiments set forth herein. In the drawings, when one layer is disposed "on" the other layer or the substrate, it means that one layer can be directly formed on the other layer of the substrate or that a third (or more) layer can be interposed between these layers. Like numbers refer to like elements throughout the specification.

FIG. 1 is a plan view showing a thin film transistor according to an embodiment of the present invention.

As shown in FIG. 1, a semiconductor layer 120, which is a polysilicon layer, is placed in one direction, and a gate electrode 140 crossing the semiconductor layer 120 is disposed on the semiconductor layer 120. An interlayer (not shown) is disposed on the gate electrode 140 and the semiconductor layer 120. Further, source/drain contact holes 150b that expose a predetermined region of both ends of the semiconductor layer 120 are disposed in the interlayer. Preferably, metal holes 150a that expose a predetermined region of the semiconductor layer are disposed between the gate electrode 140 and the source/drain contact holes 150b, respectively. It is desirable that the metal holes 150a are spaced apart from the gate electrode 140.

For the semiconductor layer 120, a region exposed through the source/drain contact hole 150b is a first MIC region crystallized by a metal induced crystallization (hereinafter, referred to as "MIC") method. Further, when the metal hole 150a is formed, a region exposed through the metal holes 150a is a second MIC region also crystallized by the MIC method. The remaining region other than the MIC regions 150a, 150b is a MILC region crystallized by a metal induced lateral crystallization (hereinafter, referred to as "MILC") method.

Figure 2B:
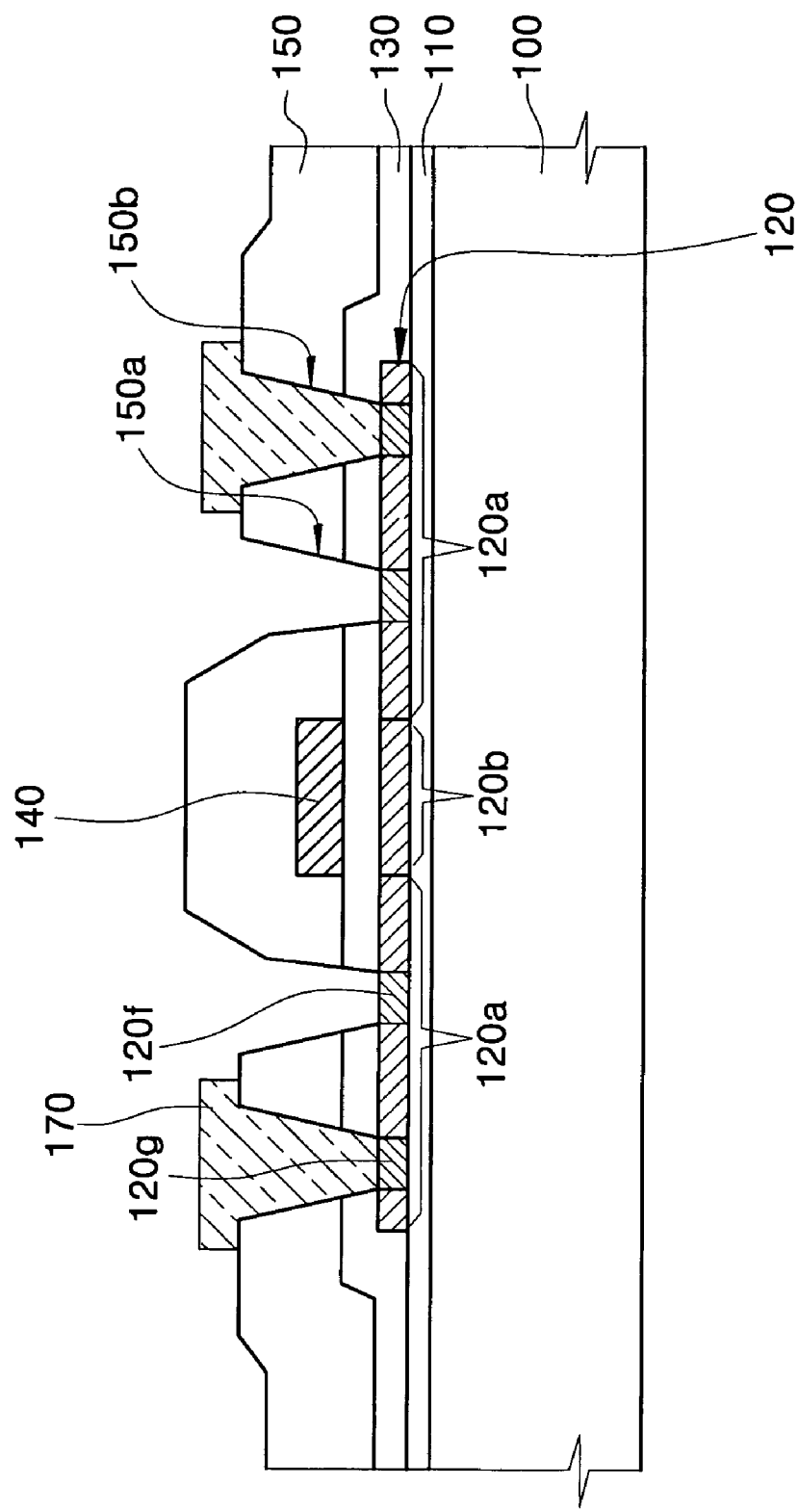

FIGS. 2A and 2B are cross sectional views for illustrating a thin film transistor and a method for fabricating the same according to an embodiment of the present invention taken along the line I–I' of FIG. 1.

As shown in FIG. 2A, a substrate 100 is provided. The substrate 100 can be a glass or a plastic substrate. Here, it is desirable that a buffer layer 110 is formed on the substrate 100. The buffer layer 110 serves to protect a semiconductor layer formed in the subsequent process from impurities emitted from the substrate 100. The buffer layer 110 can be formed of a silicon oxide layer, a silicon nitride layer, a silicon oxynitride layer and a combination thereof.

Next, an amorphous silicon layer is deposited on the buffer layer 110, and is patterned to form the semiconductor layer 120. A gate insulating layer 130 is formed on the semiconductor layer 120, and a gate conductive layer is deposited on the gate insulating layer 130 and is patterned to form a gate electrode 140.

Next, using the gate electrode 140 as a mask, impurities are injected into the semiconductor layer 120, so that source/drain regions 120a are formed in the semiconductor layer 120, and at the same time, a channel region 120b interposed between the source/drain regions 120a and disposed below the gate electrode 140 is defined.

Next, an interlayer 150 is formed on the gate electrode 140 and the gate insulating layer 130. Source/drain contact holes 150b that expose the source/drain regions 120a of the semiconductor layer 120 are formed in the interlayer 150. And at the same time, it is desirable that metal holes 150a that expose the source/drains regions 120a are formed in the interlayer between the source/drain contact holes 150b and the gate electrode 140. Preferably, the metal holes 150a are formed spaced apart from the gate electrode 140.

Next, a crystallization-inducing metal layer 160 is deposited on the entire surface of the substrate comprising the metal holes 150a and the source/drain contact holes 150b, so that the crystallization-inducing metal layer 160 is formed on the source/drain regions 120a exposed in the metal holes 150a and the source/drain contact holes 150b, respectively. The crystallization-inducing metal layer 160 is formed of at least one of the following materials: Ni, Pd, Ti, Ag, Au, Al, Sn, Sb, Cu, Co, Cr, Mo, Tr, Ru, Rh, or Cd. Preferably, the crystallization-inducing metal layer 160 is formed of Ni. Ni has merit in that a mismatch with silicon rarely occurs and crystallization can be performed at low temperature. Further, it is desirable that the crystallization-inducing metal layer 160 is formed to a thickness of a few Å to 200 Å.

Next, a first heat treatment is performed for the substrate 100 where the crystallization-inducing metal layer 160 is deposited. It is desirable that the first heat treatment is performed at a temperature of 400 to 600° C. in a furnace. More preferably, it is performed at a temperature of about 550° C.

During the first heat treatment, the source/drain regions 120a that contact the crystallization-inducing metal layer 160, namely, the regions exposed by the source/drain contact holes 150b and the metal holes 150a, respectively, react with the crystallization-inducing metal layer 160 to induce the crystallization, so that a MIC region is formed. The MIC region formed in the source/drain region exposed in the source/drain contact hole 150b is referred to as a first MIC region 120g, and the MIC region formed in the source/drain regions exposed in the metal hole 150a is referred to as a second MIC region 120f. In the regions other than the MIC regions, 120f and 120g, that is, the regions of the semiconductor layer 120 that do not contact the crystallization-inducing metal layer 160, crystallization is induced from the MIC regions, 120f and 120g, to form the MILC region. With this, the semiconductor layer 120, which is a polysilicon layer, having the MIC regions, 120f and 120g, and the MILC region is formed.

When the metal holes 150a are formed, a region between the second MIC regions 120f is crystallized by the MILC during the first heat treatment. On the other hand, when the metal holes 150a are not formed, a region between the first MIC regions 120g is crystallized by the MILC during the first heat treatment. Therefore, as the metal holes 150a are formed in the interlayer between the source/drain contact holes 150b and the gate electrode, the length crystallized by the MILC can be reduced, such that the first heat treatment time can be reduced.

MILC crystalline grains formed in the MILC region, that is, first crystalline grains, have a particular orientation and are generally formed in an elongated form. The first crystalline grains can have at least one first direction crystalline grain grown in a first direction and at least one second direction crystalline grain grown in a second direction different from the first direction. During the first heat treatment, the first direction crystalline grain and the second direction crystalline grain, grown by the first heat treatment, come to contact each other. This contact region may be considered a boundary region. This region exists because each grain inhibits the opposing growth of the other grain. Therefore, the region partially surrounded by the first direction crystalline grain and the second direction crystalline grain may remain amorphous silicon. The remaining amorphous silicon, especially the amorphous silicon that remains in the channel region 120b, acts as a factor that degrades electron mobility of the semiconductor layer 120.

Next, a second heat treatment may be performed for the substrate where the MILC region is formed. The second heat treatment can be performed at the same temperature as the first heat treatment. However, it is desirable that the second heat treatment is performed at a temperature higher than that of the first heat treatment. With this, the crystallization time can be reduced compared with the case in which the second heat treatment is performed at the same temperature as the first heat treatment. It may be desirable that the second heat treatment be performed at a temperature above 600° C. More preferably, the second heat treatment may be performed at a temperature of 600 to 750° C. Further, the second heat treatment can be performed in the furnace, following the first heat treatment. Alternatively, the second heat treatment can be performed by rapid thermal annealing (RTA) using a tungsten halogen or xenon arc heat lamp.

By performing the second heat treatment, the region where the amorphous silicon is left between the first crystalline grains can be further crystallized. The region further crystallized by the second heat treatment is referred to as an "additional crystallization region." In the additional crystallization region, the second crystalline grains are formed having different crystalline properties from the first crystalline grains. The second crystalline grains are formed by the second heat treatment of the remaining amorphous silicon at the boundary region and can have a smaller crystallization size than the first crystallization grains. Further, the second crystalline grains can be formed by solid-phase crystallization (SPC). Consequently, by the second heat treatment, the amorphous silicon should not significantly remain among the first crystalline grains. Thus the electrical characteristics such as electron mobility of the semiconductor layer and uniformity of the electrical characteristics over the substrate can be improved.

Meanwhile, during the heat treatment, the impurities doped in the semiconductor layer 120 may be activated.

As shown in FIG. 2B, the crystallization-inducing metal layer 160 that does not react with the semiconductor layer 120 may be removed, so that the semiconductor layer 120 in the metal holes 150a and the source/drain contact holes 150b may be exposed. A source/drain conductive layer may be deposited on the entire surface of the substrate comprising the exposed semiconductor layer 120, and may be patterned to form source/drain electrodes that contact the semiconductor layer exposed in the source/drain contact holes 150b.

Next, an insulating layer (not shown) is deposited on the entire surface of the substrate to fill the metal holes 150a.

Figure 3:
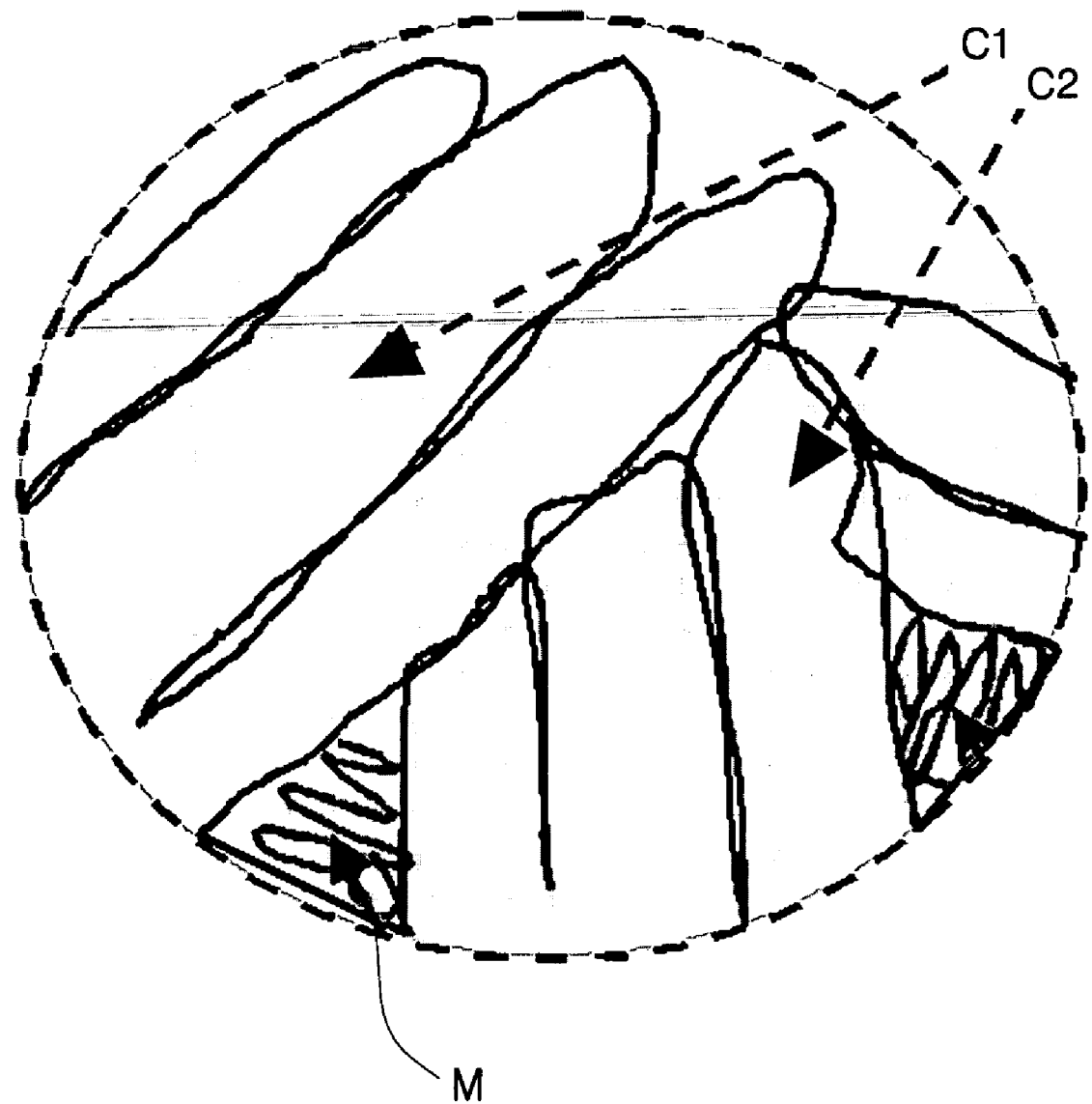
FIG. 3 is a plan view enlarging a semiconductor layer of the region indicated as "A" in FIG. 1.

FIG. 3 is a plan view enlarging the semiconductor layer of the region indicated as "A" in FIG. 1.

As shown in FIG. 3, a plurality of first crystalline grains C1 and C2 crystallized by the MILC method are disposed in the semiconductor layer. The second crystalline grains having different crystalline properties from the first crystalline grains are disposed between the first crystalline grains C1 and C2. More specifically, the first crystalline grains C1 and C2 include the first direction first crystalline grain C1 grown in a first direction and the second direction first crystalline grain C2 grown in a second direction. On the other hand the second crystalline grains M may be disposed in the region which may be partially defined by the meeting of the first direction crystalline grain C1 and the second direction crystalline grain C2. For example, the region partially surrounded by the first direction crystalline grain C1 and the second direction crystalline grain C2 may correspond to the location of second crystalline grains M.

As described above, according to the present invention, electrical characteristics such as electron mobility of the thin film transistor using a polysilicon layer as well as uniformity of the electrical characteristics over the substrate can be improved.

What is claimed is:

1. A thin film transistor, comprising:
    a semiconductor layer having a metal induced lateral crystallization region that has first crystalline grains and second crystalline grains disposed between the first crystalline grains and having different crystalline properties from the first crystalline grains,
    a gate electrode disposed on the metal induced lateral crystallization region; an interlayer that covers the gate electrode and the semiconductor layer; a source/drain contact hole disposed in the interlayer and exposing the semiconductor layer; and the source/drain electrode disposed on the interlayer and contacting the semiconductor layer through the source/drain contact hole,
    wherein a metal hole is disposed in the interlayer between the source/drain contact hole and the gate electrode and exposes the semiconductor layer.

2. The thin film transistor of claim 1,
    wherein the first crystalline grains include at least one first direction first crystalline grain grown in a first direction and at least one second direction first crystalline grain grown in a second direction, and
    wherein the second crystalline grains are disposed at a place partially surrounded by the first direction first crystalline grain and the second direction first crystalline grain.

3. The thin film transistor of claim 1, wherein the second crystalline grains have crystalline grain sizes smaller than that of the first crystalline grain.

4. The thin film transistor of claim 1, wherein the second crystalline grains are formed by solid-phase crystallization.

5. The thin film transistor of claim 1, wherein the first crystalline grains are crystallized at a temperature of 400 to 600° C.

6. The thin film transistor of claim 1, wherein the second crystalline grains are crystallized at a temperature of 600 to 750° C.

7. A method for fabricating a thin film transistor, comprising:
    depositing amorphous silicon on a substrate and patterning the deposited amorphous silicon to form a semiconductor layer;
    depositing a crystallization-inducing metal layer on a plurality of regions of the semiconductor layer;
    performing a first heat treatment of the substrate where the crystallization-inducing metal layer is deposited, forming a metal induced lateral crystallization region in the semiconductor layer; and
    performing a second heat treatment of the substrate where the metal induced lateral crystallization region region is formed at a temperature higher than in the first heat treatment,
    wherein upon performing the second heat treatment, the metal induced lateral crystallization region has first crystalline grains and second crystalline grains, the second crystalline grains having a smaller crystalline size than the first crystalline grains and different crystalline properties from the first crystalline grains.

8. The method of claim 7, wherein the first heat treatment is performed at a temperature of 400 to 600° C.

9. The method of claim 7, wherein the second heat treatment is performed at a temperature of 600 to 750° C.

10. The method of claim 7, wherein the step of depositing the crystallization-inducing metal layer includes the substeps of:
    forming a gate electrode on the semiconductor layer;
    forming an interlayer on the gate electrode and the semiconductor layer;
    forming a source/drain contact hole in the interlayer, exposing the semiconductor layer in the source/drain contact hole; and
    depositing the crystallization-inducing metal layer on the semiconductor layer exposed in the source/drain contact hole.

11. The method of claim 10, wherein the step of forming the source/drain contact hole in the interlayer is performed simultaneously with forming a metal hole that exposes the semiconductor layer in the interlayer, between the source/drain contact hole and the gate electrode; and
    while depositing the crystallization-inducing metal layer on the semiconductor layer exposed in the source/drain contact hole, depositing the crystallization-inducing metal layer also on the semiconductor layer exposed in the metal hole.

12. The method of claim 11, further comprising the steps of:
    after performing the second heat treatment, removing the crystallization-inducing metal layer; and
    depositing a source/drain conductive layer on the substrate, and patterning the deposited source/drain conductive layer to form a source/drain electrode that contacts the semiconductor layer through the source/drain contact hole,
    wherein the step of patterning the source/drain conductive layer comprises removing the source/drain conductive layer deposited on the semiconductor layer exposed in the metal hole.

* * * * *